United States Patent
Petrat et al.

(10) Patent No.: US 8,673,502 B2
(45) Date of Patent: Mar. 18, 2014

(54) METHOD FOR PRODUCING COATED CARBON PARTICLES AND USE OF THE LATTER IN ANODE MATERIALS FOR LITHIUM-ION BATTERIES

(75) Inventors: Frank-Martin Petrat, Muenster (DE); Hartmut Wiggers, Reken (DE); Burkhard Reeken, Dorsten (DE); Michael Holzapfel, Munich (DE); Hilmi Buqa, Brugg (CH); Petr Novak, Brugg (CH)

(73) Assignee: EVONIK DEGUSSA GmbH, Essen (DE)

(*) Notice: Subject to any disclaimer, the term of this patent is extended or adjusted under 35 U.S.C. 154(b) by 1206 days.

(21) Appl. No.: 11/908,458

(22) PCT Filed: Jan. 25, 2006

(86) PCT No.: PCT/EP2006/050438
§ 371 (c)(1),
(2), (4) Date: Sep. 12, 2007

(87) PCT Pub. No.: WO2006/097380
PCT Pub. Date: Sep. 21, 2006

(65) Prior Publication Data
US 2008/0145761 A1    Jun. 19, 2008

(30) Foreign Application Priority Data
Mar. 14, 2005   (DE) .................. 10 2005 011 940

(51) Int. Cl.
*H01M 4/13*   (2010.01)

(52) U.S. Cl.
USPC ................. 429/231.8; 429/231.7; 429/231.95

(58) Field of Classification Search
USPC ....................... 429/231, 231.7, 231.8, 231.95
See application file for complete search history.

(56) References Cited

U.S. PATENT DOCUMENTS

| | | | |
|---|---|---|---|
| 3,617,347 A | 11/1971 | Kuratomi | |
| 5,277,940 A | 1/1994 | Caballero | |
| 2002/0009646 A1* | 1/2002 | Matsubara et al. | ........ 429/231.8 |
| 2007/0094757 A1 | 4/2007 | Pridohl et al. | |

FOREIGN PATENT DOCUMENTS

| | | |
|---|---|---|
| GB | 1 228 253 | 4/1971 |
| JP | 2004 182512 | 7/2004 |
| WO | 2005 096414 | 10/2005 |

OTHER PUBLICATIONS

Takahiro Hasegawa, et al., "Preparation of Carbon Gel Microspheres Containing Silicon Powder for Lithium Ion Battery Anodes", Carbon, vol. 42, No. 12-13, XP 004526567, pp. 2573-2579, 2004.
S. Bourderau, et al., "Amorphous Silicon as a Possible Anode Material for Li-Ion Batteries", Journal of Power Sources, vol. 81-82, pp. 233-236, 1999.

(Continued)

*Primary Examiner* — Jane Rhee
(74) *Attorney, Agent, or Firm* — Oblon, Spivak, McClelland, Maier & Neustadt, L.L.P.

(57) ABSTRACT

The invention relates to a process for producing coated carbon particles, which comprises coating electrically conductive carbon particles with elemental doped or undoped silicon by chemical vapor deposition from at least one gaseous silane in an oxygen-free gas atmosphere in a reaction space, with the electrically conductive carbon particles being in continual motion during the vapor deposition, and also correspondingly coated carbon particles and their use in anode materials for lithium ion batteries.

22 Claims, 1 Drawing Sheet

(56) References Cited

OTHER PUBLICATIONS

Figure 1:
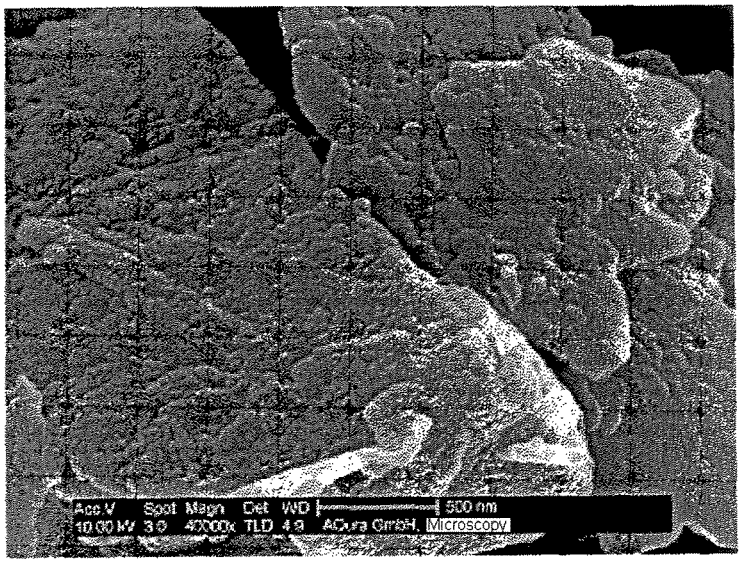

H. Buqa, et al., "Recent Improvements in Electrochemical Performance of Graphite Electrode for Lithium-Ion Batteries", ITE Letters, vol. 4, No. 1, pp. B 13 (38)-613 (43), 2003.

Nikolay Dimov, et al., "Carbon-Coated Silicon As Anode Material for Lithium Ion Batteries: Advantages and Limitations", Electrochimica Acta, vol. 48, pp. 1579-1587, 2003.

Deutsche Norm, "Determination of the Specific Surface Area of Solids by Gas Adsorption Using the Bet Method (ISO 9277: 1995)", DIN ISO 9277, pp. 1-19, 2003.

Bo Gao, et al., "Alloy Formation in Nanostructured Silicon", Advanced Materials, vol. 13, No. 11, pp. 816-819, 2001.

J. Graetz, et al., "Highly Reversible Lithium Storage in Nanostructured Silicon", Electrochemical and Solid-State Letters, vol. 6, No. 9, pp. A194-A197, 2003.

Robert A. Huggins, "Alternative Materials for Negative Electrodes in Lithium Systems", Solid State Ionics, 152-153, pp. 61-68, 2002.

W. J. Weydanz, et al., "A Room Temperature Study of the Binary Lithium-Silicon and the Ternary Lithium-Chromium-Silicon System for Use in Rechargeable Lithium Batteries", Journal of Power Sources, 81-82, pp. 237-242, 1999.

Keith D. Kepler, et al., "LixCu6Sn5 ($0 < x < 13$): An Intermetallic Insertion Electrode for Rechargeable Lithium Batteries", Electrochemical and Solid-State Letters, vol. 2, No. 7, pp. 307-309, 1999.

San-Cheng Lai, "Solid Lithium-Silicon Electrode", Brief Communications, vol. 123, No, 8, pp. 1196-1197, 1976.

D. Larcher, et al., "Si-Containing Disordered Carbons Prepared by Pyrolysis of Pitch/Polysilane Blends: Effect of Oxygen and Sulfur", Solid State Ionics, vol. 122, pp. 71-83, 1999.

Hong Li, et al., "A High Capacity Nano-Si Composite Anode Material for Lithium Rechargeable Batteries", Electrochemical and Solid-State Letters, vol. 2, No. 11, pp. 547-549, 1999.

M. J. Lindsay, at al., "Al-Based Anode Materials for Li-Ion Batteries", Journal of Power Sources, 119-121, pp. 84-87, 2003.

Corina Lupu, et al., "X-Ray and Neutron Diffraction Studies on Li4.4Sn", Inorganic Chemistry, vol. 42, No. 12, pp. 3765-3771, 2003.

Jianjun Niu, et al., "Improvement of Usable Capacity and Cyclability of Silicon-Based Anode Materials for Lithium Batteries by Sol-Gel Graphite Matrix", Electrochemical and Solid-State Letters, vol. 5, No. 6, pp. A107-A110, 2002.

Randall N. Seefurth, et al., "Investigation of Lithium Utilization From a Lithium-Silicon Electrode", J. Electrochem. Soc., vol. 124, No. 8, pp. 1207-1214, 1977.

Jose L. Tirado, "Inorganic Materials for the Negative Electrode of Lithium-Ion Batteries: State-of-The-Art and Future Prospects", Materials Science and Engineering, R40, No. 3, pp. 103-136, 2003.

Z.S. Wen, et al., "High Capacity Silicon/Carbon Composite Anode Materials for Lithium Ion Batteries", Electrochemistry Communications, vol. 5, pp. 165-168, 2003.

A. M. Wilson, et al., "Lithium Insertion in Carbons Containing Nanodispersed Silicon", J. Electrochem. Soc., vol. 142, No. 2, pp. 326-332, 1995.

Martin Winter, et al., "Electrochemical Lithiation of Tin and Tin-Based Intermetallics and Composites", Electrochemica Acta, vol. 45, pp. 31-50, 1999.

Martin Winter, et al., Insertion Electrode Materials for Rechargeable Lithium Batteries, Advanced Materials, vol. 10, No. 10, pp. 725-763, 1998.

J. O. Besenhard, et al., "Will Advanced Lithium-Alloy Anodes Have a Chance in Lithium-Ion Batteries?", Journal of Power Sources, vol. 68, pp. 87-90, 1997.

Jun Yang, et al., "Sub-Microcrystalline Sn and Sn-SnSb Powders As Lithium Storage Materials for Lithium-Ion Batteries", Electrochemical and Solid-State Letters, vol. 2, No. 4, pp. 161-163, 1999.

J. Yang, et al., "Small Particle Size Multiphase Li-Alloy Anodes for Lithium-Ion-Batteries", Solid State Ionics, vol. 90, pp. 281-287, 1996.

J. Yang, et al., "Si/C Composites for High Capacity Lithium Storage Materials", Electrochemical and Solid-State Letters, vol. 6, No. 8, pp. A154-A156, 2003.

U.S. Appl. No. 10/579,762 filed Jan. 30, 2007, Pridoehl, et al.
U.S. Appl. No. 10/594,995, filed Sep. 29, 2006, Petrat, et al.

\* cited by examiner

METHOD FOR PRODUCING COATED CARBON PARTICLES AND USE OF THE LATTER IN ANODE MATERIALS FOR LITHIUM-ION BATTERIES

The invention relates to a process for producing coated carbon particles, the coated carbon particles and their use for producing anode material for lithium ion batteries.

Lithium ion batteries are industrially very important energy storing systems since they have the highest energy density of up to 180 Wh/kg among known chemical and electrochemical energy stores which can be used in practice. Lithium ion batteries are employed especially in the field of portable electronics, for example laptops or mobile telephones. The use of lithium ion batteries in the field of transport means, for example bicycles or automobiles, is also being discussed.

The negative electrode material (anode) used is mostly graphitic carbon. Graphitic carbon has stable cycling properties and a quite high degree of handling safety compared to lithium metal which is used in "lithium batteries". An important argument for the use of graphitic carbon in negative electrode materials is the small volume changes of the host material associated with the intercalation and release of lithium, i.e. the electrode remains approximately stable. Thus, a volume increase of about 10% is measured for the intercalation of lithium in graphitic carbon in the case of the limiting stoichiometry of $LiC_6$. However, a disadvantage of graphitic carbon is its relatively low electrochemical capacity of, theoretically, 372 mAh/g of graphite, which corresponds to only about a tenth of the electrochemical capacity which can be achieved theoretically using lithium metal of 3862 mAh/g of lithium.

For this reason, alternative materials have long been sought, especially among alloys, for example binary alloys based on aluminum (Lindsay et al. in J. Power Sources 119 (2003), 84), tin (Winter et al. in Electrochim. Acta 45 (1999), 31; Tirado in Mater. Sci. Eng. R-Rep. 40 (2003), 103) or antimony (Tirado in Mater. Sci. Eng. R-Rep. 40 (2003), 103), ternary alloys based on copper-tin (Kepler et al. in Electrochem Solid-State Lett 2 (1999), 307) or copper-antimony (Yang et al. in Electrochem. Solid State Lett. 2 (1999), 161) or metal oxides based on tin oxide (Huggins in Solid State Ion. 152 (2002), 61). These materials have high theoretical specific capacities of, for example, 994 mAh/g in the case of tin. If these high theoretical capacities were able to be utilized reversibly, a significant increase in the energy density of lithium ion batteries would be possible.

Compared to metallic lithium, anode materials based on alloys have the advantage that dendrite formation does not occur during lithium deposition. In contrast to graphite materials, anode materials based on alloys are suitable for use together with electrolytes based on propylene carbonate. This makes it possible to use lithium ion batteries at low temperatures. However, a disadvantage of these alloys is the large volume expansion during cycling, i.e. during intercalation and release of lithium, which is above 200% and sometimes even up to 300% (Besenhard et al. in J. Power Sources 68 (1997), 87).

Silicon has likewise been examined because, like tin, it forms binary compounds with lithium which are electrochemically active (Weydanz et al. in Journal of Power Sources 82 (1999), 237; Seefurth et al. in J. Electrochem. Soc. 124 (1977), 1207; Lai in J. Electrochem. Soc. 123 (1976), 1196). These binary compounds of lithium and silicon have a very high lithium content. The theoretical maximum lithium content corresponds to $Li_{4.2}Si$ which has a very high theoretical specific capacity of about 4400 mAh/g of silicon (Lupu et al. in Inorg. Chem. 42 (2003), 3765). These binary compounds are formed at a similarly low potential as the intercalation compounds of lithium in graphite of <500 mV vs. $Li/Li^+$ (i.e. relative to the potential of metallic lithium which serves as reference). As in the case of the abovementioned binary alloys, in the case of silicon the intercalation and release of lithium is associated with a very large volume expansion which can be up to a maximum of 323%. This volume expansion leads to severe mechanical stress on the crystallites and thus to the particles becoming amorphous and disintegrating with loss of electrical contact (Winter et al. in Adv. Mater. 10 (1998), 725; Yang et al. in Solid State Ion. 90 (1996), 281; Bourderau et al. in J. Power Sources 82 (1999), 233). This mechanical stress has a particularly strong effect on the first cycle, during which a very high irreversible capacity occurs (up to 50% or more), which has hitherto made the use of the material as negative electrode impossible.

Various techniques have been used for improving the adhesion of silicon to the support material, for example intensive milling for a number of hours (Dimov et al. in Electrochim. Acta 48 (2003), 1579; Niu et al. in Electrochem. Solid State Lett. 5 (2002), A107), carbon coating from the gas phase (Wilson et al. in J. Electrochem. Soc. 142 (1995), 326), and pyrolysis of an intimate mixture of the respective precursors (Larcher et al. in Solid State Ion. 122 (1999), 71; Wen et al. in Electrochem. Commun 5 (2003), 165). Here, experiments have been carried out using both silicon-rich (60-80% by weight of Si) formulations and low-silicon (5-20% by weight of Si) formulations.

Experiments using nanosize materials, i.e. materials having a particle size of about 100 nm, are described by Graetz et al. in Electrochem. Solid State Lett. 6 (2003), A194; Li et al. in Electrochem. Solid State Lett. 2 (1999), 547, Yang et al. in Electrochem. Solid State Lett. 6 (2003), A154 and Gao et al. in Adv. Mater. 13 (2001), 816. Graetz et al. describe the preparation of nanosize silicon films which display a reversible capacity of more than 2300 mAh/g (in the case of a film deposited by means of chemical vapor deposition) or 1100 mAh/g (in the case of the film which builds up on particles), but fading is relatively high. Li et al. utilize a mixture of nanosize silicon and carbon black which likewise displays a very high initial capacity of over 2000 mAh/g, but this drops significantly during cycling and less than 25 cycles are shown. Yang et al. utilize the pyrolysis of a starting mixture comprising nanosize silicon for producing their active materials and obtain reversible capacities of over 700 mAh/g during 30 cycles, but fading could not be avoided in this case either. Gao et al. describe the electrochemical reaction of silicon obtained by laser ablation with lithium, but obtain an initial reversible capacity of about 700 mAh/g.

It is therefore an object of the present invention to provide an anode material for lithium ion batteries which displays increased mechanical stability during cycling and a high specific capacity.

It has surprisingly been found that anode material comprising electrically conductive carbon particles coated with elemental silicon has a higher mechanical stability during cycling than silicon-containing anode material according to the prior art. The anode material of the invention displays a lower irreversible capacity loss in the first cycle. Furthermore, the anode material of the invention displays lower fading, as a result of which the cycle time is increased. This makes it possible to exploit the advantages of silicon, namely its very high specific capacity, without the degradation caused by mechanical destruction due to volume expansion which is usually observed. The use of the coated carbon particles of the invention enables the capacity of lithium ion batteries to be significantly increased. This makes it possible to increase the operating time of electric appliances between two charging procedures for the same geometry of the cells in the lithium ion batteries. The user of such appliances provided with lithium ion batteries comprising an anode material according to the invention directly experiences greater comfort due to greater independence from mains electricity. A further advantage is the opportunity of making the cells of the lithium ion battery smaller at a constant capacity, so as to obtain smaller electric appliances. This opens up fields of application which have hitherto not been possible for lithium ion batteries because of the size of the corresponding cells.

The invention provides a process for producing coated carbon particles, which comprises coating electrically conductive carbon particles with elemental doped or undoped silicon by chemical vapor deposition from at least one gaseous silane in an oxygen-free gas atmosphere in a reaction space, with the electrically conductive carbon particles being in continual motion during the vapor deposition.

The invention further provides coated carbon particles in which an electrically conductive carbon core has been coated with elemental doped or undoped silicon, and also provides for their use for producing anode material for lithium ion batteries.

The invention also provides an anode material for lithium ion batteries which comprises coated carbon particles according to the invention, and also a lithium ion battery which comprises an anode comprising an anode material according to the invention.

In the process of the invention for producing coated carbon particles, electrically conductive carbon particles are coated with elemental doped or undoped silicon by chemical vapor deposition from at least one gaseous silane in an oxygen-free gas atmosphere in a reaction space, with the electrically conductive carbon particles being in continual motion during the vapor deposition.

In the process of the invention, the electrically conductive carbon particles in the reaction space are in continual motion so as to achieve uniform coating of these carbon particles. This can be achieved, for example, by means of the gas stream introduced into the reaction space. Here, the reactor geometry, in particular the arrangement of the inlet for the gas stream, and the volume flow of the gas stream introduced are selected so that movement of the electrically conductive carbon particles results. For example, the process of the invention can be carried out in a fluidized-bed reactor. A further possibility is carrying out the vapor deposition in a rotary tube furnace so as to force movement or mixing of the carbon particles.

The carbon particles to be coated can be fed either batchwise or continuously into the reaction space, and the coated carbon particles can be discharged from the reaction space either batchwise or continuously. Thus, the process of the invention can be carried out batchwise or continuously.

The process of the invention is preferably carried out using electrically conductive carbon particles which are amorphous and/or crystalline in the form of graphite, but preference is given to using graphite particles. The use of electrically conductive carbon particles which preferably have a specific resistance of not more than $10^{-2}$ Ω cm is important for the process of the invention.

The process of the invention is preferably carried out using carbon particles having a purity of at least 97%, preferably a purity of at least 98% and particularly preferably 99%. In particular, carbon particles having a mean particle diameter of from 10 nm to 44 μm, preferably from 20 nm to 15 μm, are used in the process of the invention. The process of the invention is advantageously carried out using graphite particles having a mean particle diameter of from 4 to 10 μm. It is also possible to use carbon black particles made up of primary particles associated to form aggregates and/or agglomerates as carbon particles in the process of the invention. In this case, the primary particles preferably have a mean particle diameter of from 20 to 60 nm.

For the purposes of the present invention, aggregates are made up of spherical or largely spherical primary particles as are initially formed in the reaction for producing the carbon black particles which have grown together to form aggregates in the further course of the reaction. The degree of growth of the aggregates can be influenced by the process parameters in the production of the carbon black particles. These aggregates can form agglomerates in the further course of the reaction. In contrast to the aggregates, which can generally not be broken up into primary particles, or can be broken up only partially into primary particles, the term agglomerates as used for the purposes of the present invention refers to only a loose clumping of aggregates which can easily disintegrate into the aggregates.

For the purposes of the present invention, a mean particle diameter is the $d_{50}$, i.e. a mean particle diameter of 5 μm means that 50% of all particles have a particle diameter of less than or equal to 5 μm. In the process of the invention, preference is given to using carbon particles having a BET surface area of from 5 to 700 m$^2$/g, preferably from 6 to 140 m$^2$/g and particularly preferably from 10 to 50 m$^2$/g. For the purposes of the present invention, the BET surface area is determined in accordance with ISO 9277 (1995), which has replaced DIN 66131.

Preference is given to using graphite as is marketed, for example, by the company Timcal under the trade name TIMREX as carbon particles in the process of the invention.

In a particular embodiment of the process of the invention, carbon particles whose surface has been modified beforehand by means of a suitable method are used. This can be achieved, for example, by means of a plasma, by means of ozonization or by means of a wet chemical process. The modification of the carbon particles used in the process of the invention can either be carried out in a further reactor prior to carrying out the process of the invention or can be carried out in a preceding process step in the same coating plant as the process of the invention.

The gas stream introduced into the reaction space in the process of the invention preferably comprises not only the gaseous silane and optionally the gaseous compounds of the doping elements but also a carrier gas. As carrier gas, it is possible to use helium, neon, hydrogen, nitrogen or argon, preferably hydrogen, nitrogen or argon and particularly preferably argon, in the process of the invention. The oxygen-free gas atmosphere preferably comprises the carrier gas, the silane and the gaseous compound of the doping elements.

In the process of the invention, preference is given to introducing a gas stream comprising at least a gaseous silane and argon into the reaction space. Preference is given to using at least one silane selected from among $SiH_4$, $Si_2H_6$, $ClSiH_3$, $Cl_2SiH_2$, $Cl_3SiH$ and $SiCl_4$ in the process of the invention; particular preference is given to using a gas stream comprising only monosilane $SiH_4$ as gaseous silane. In a particular embodiment of the process of the invention, the gas stream used comprises a mixture of a plurality of gaseous silanes. For the purposes of the present invention, the term silanes encompasses silicon-hydrogen compounds and also silicon-chlorine-hydrogen compounds and silicon-chlorine compounds. The gas stream used in the process of the invention preferably comprises from 0.5 to 100% by volume, more preferably from 1 to 90% by volume and particularly preferably from 5 to 50% by volume, of gaseous silane, based on the gas stream introduced into the reaction space.

In a particular embodiment of the process of the invention, the gas stream introduced into the reaction space comprises gaseous compounds of doping elements selected from among phosphorus, arsenic, antimony, boron, aluminum, gallium and indium in addition to the gaseous silane. Particular preference is given to using diborane and phosphane or substituted phosphanes, for example $tBuPH_2$, $tBu_3P$, $tBuPh_2P$ or $tBuPh_2P$ and trismethylaminophosphane $((CH_3)_2N)_3P$. The gas stream introduced into the reaction space preferably contains not more than 1% by volume, more preferably not more than 0.1% by volume, of gaseous compounds of the doping elements.

In a further embodiment of the process of the invention, a vaporizable organolithium compound, in particular butyllithium, is introduced into the reaction space in addition to the silane. The gas stream introduced advantageously contains at least 1% by volume of the organolithium compound.

In a preferred embodiment of the process of the invention, a gas stream consisting of a silane, particularly preferably monosilane, and an inert gas, particularly preferably argon, is introduced into the reaction space. In a further embodiment, a gas stream comprising not only the silane and the inert gas but also a gaseous compound of a doping element is used.

The residence time of the gas stream introduced into the reaction space is preferably selected so that virtually quantitative reaction of the silane occurs. The residence time in the process of the invention is therefore preferably from 0.1 to 10 seconds and more preferably from 1 to 5 seconds.

The vapor deposition, in which the gaseous silanes used and, if appropriate, the gaseous compounds of the doping elements and/or organolithium compounds are decomposed to form elemental doped or undoped silicon, is preferably carried out at a temperature of from 500° C. to 1400° C., more preferably 600° C. to 1200° C. and particularly preferably from 630° C. to 1000° C., in the process of the invention. The process of the invention is preferably carried out at a pressure of from 100 to 1200 mbar and preferably at a pressure of from 500 to 1200 mbar.

The energy necessary for decomposing the silane in the process of the invention can be introduced via wall heating of the reaction space or can be introduced via microwave heating or by irradiation by means of laser light.

In the coated carbon particles of the invention, an electrically conductive carbon core has been coated with elemental doped or undoped silicon. The coated carbon particle of the invention is preferably obtainable by means of the process of the invention.

The electrically conductive carbon core of the coated carbon particle of the invention is preferably amorphous and/or crystalline in the form of graphite and is particularly preferably crystalline in the form of graphite. The specific resistance of the electrically conductive carbon core of the coated carbon particles of the invention is preferably not more than $10^{-2}$ $\Omega$ cm.

The coated carbon particles of the invention preferably have a mean particle diameter of from 10 nm to 65 µm, preferably from 20 nm to 25 µm. Coated carbon particles according to the invention which have an electrically conductive carbon core of carbon black particularly preferably have a mean particle diameter of the primary particles of from 20 to 90 nm. Coated carbon particles according to the invention having an electrically conductive carbon core of graphite particularly preferably have a mean particle diameter of from 5 to 15 µm. The BET surface area of the coated carbon particles of the invention is preferably from 5 to 700 $m^2/g$, more preferably from 6 to 140 $m^2/g$ and particularly preferably from 10 to 50 $m^2/g$. For the purposes of the present invention, the BET surface area is determined in accordance with ISO 9277 (1995), which has replaced DIN 66131.

The coated carbon particles of the invention preferably comprise from 4 to 60% by weight, more preferably from 5 to 50% by weight and particularly preferably from 6 to 40% by weight, of silicon, based on the coated carbon particles. The percentage by weight of silicon is determined gravimetrically, and the carbon is determined via the carbon dioxide liberated in a combustion analysis.

The elemental silicon coating of the coated carbon particles of the invention preferably comprises doping elements selected from among phosphorus, arsenic, antimony, boron, aluminum, gallium and indium. The proportion of these doping elements in the coating can be up to a maximum of 1 atom-%. In general, the coating contains amounts of the doping elements in the ppm or even ppb range. Preference is given to a range from $10^{15}$ to $10^{19}$ atoms of doping elements/$cm^3$.

It is likewise possible for the coating of the coated carbon particles of the invention to contain lithium as additional element. The proportion of lithium in the coating can, corresponding to the most highly lithiated silicon compound, be up to 50% by weight. Particular preference is given to up to 20-40% by weight of lithium being present in the coating.

The doping element and/or additional element can be homogeneously distributed in the coating of the carbon particles of the invention, or can be present in a higher concentration in the carbon core or be intercalated therein. The doping elements are preferably incorporated in lattice sites in the silicon. This is dependent essentially on the gaseous compounds of the doping element and the reaction conditions in the production of the coated carbon particles.

The invention further provides for the use of the coated carbon particles of the invention or the coated carbon particles produced by means of the process of the invention for producing anode material for lithium ion batteries. For this purpose, the coated carbon particles of the invention are preferably suspended together with a binder in a solvent in which the binder preferably dissolves. It can be advantageous in this case for the suspension to be heated to a temperature below the decomposition point of the binder and below the boiling point of the solvent.

For the purposes of the present invention, an electrode material is a material or a mixture of two or more materials which allow(s) electrochemical energy to be stored in a battery by means of oxidation and/or reduction reactions. Depending on whether the electrochemical reaction which produces energy in the (charged) battery is an oxidation or reduction, the electrode material is referred to as a negative or positive electrode material or an anode or cathode material.

The suspension can be applied in a thickness of from 1 µm to 500 µm, preferably from 2 µm to 100 µm, to a current collector, in particular a copper foil, by means of a doctor blade. Other coating processes can likewise be used. Before coating the current collector with the suspension, a treatment of the current collector with a commercial primer based on polymer resins can be carried out. It increases the adhesion of the anode material to the current collector but itself has virtually no electrochemical activity. However, other bonding agents can also be used or the use of the bonding agent can be dispensed with entirely. In a preferred embodiment, the suspension is applied directly to a current collector.

In a particular embodiment of the use according to the invention, a composition comprising or consisting of
- 5-86% by weight of the coated carbon particles of the invention,
- 4-20% by weight of a binder,
- 0-10% by weight of a conductivity improver and
- 0-40% by weight of graphite having a mean particle diameter of from 1 µm to 100 µm, where the proportions of the components add up to a maximum of 100% by weight, is suspended in a solvent and applied to a current collector by means of a doctor blade. Preference is given to employing a composition comprising or consisting of
- 5-86% by weight of the coated carbon particles of the invention,
- 4-20% by weight of a binder and
- 0-10% by weight of a conductivity improver, but particularly preferably a composition comprising or consisting of
- 5-86% by weight of the coated carbon particles of the invention and
- 4-20% by weight of a binder, in the use according to the invention.

As conductivity improver, preference is given to employing a conductive carbon black in the use according to the invention. It can be advantageous for the composition in the use according to the invention to contain from 0 to 5% by weight, preferably from 0.5 to 4% by weight, of conductive carbon black. The composition preferably comprises a high-purity synthetic carbon black as conductive carbon black. This preferably has a mean particle diameter of from 20 to 60 nm, particularly preferably from 30 to 50 nm. It is also advantageous for the conductive carbon black present in this composition to have a BET surface area of from 50 to 80 $m^2/g$, preferably from 55 to 70 $m^2/g$. In a particular embodiment of the use according to the invention, the composition comprises a high-purity synthetic carbon black having a mean particle diameter of from 35 to 45 nm and a BET surface area of from 57 to 67 $m^2/g$ as conductive carbon black.

It can likewise be advantageous for the composition to contain from 4 to 20% by weight, preferably from 5 to 10% by weight and particularly preferably 10% by weight, of a binder. For the purposes of the present invention, a binder is a chemical compound which is able to bind the components of the coated carbon particles of the invention, graphite and, if applicable, conductive carbon black to one another and to the current collector which preferably comprises copper, nickel or stainless steel. This composition preferably comprises polymeric binders, more preferably polyvinylidene fluoride, polytetrafluoroethylene or polyolefins, but particularly preferably thermoplastic elastomers, in particular ethylene-propylene-diene terpolymers. In a particular embodiment of the use according to the invention, this composition comprises gelatin or modified cellulose as binder.

The composition in the use according to the invention preferably contains from 0 to 40% by weight of graphite which preferably has a mean particle diameter of from 1 to 100 µm, more preferably from 2 to 50 µm. The graphite present in this composition preferably has a $d_{90}$ of from 5 to 10 µm. For the purposes of the present invention, a $d_{90}$ of 6 µm means that 90% of all particles have a particle diameter of less than or equal to 6 µm. The graphite present in the composition preferably has a BET surface area of preferably from 5 to 30 $m^2/g$, more preferably from 10 to 20 $m^2/g$.

The anode material of the invention comprises coated carbon particles according to the invention. The anode material of the invention preferably comprises
- 5-86% by weight of the coated carbon particles of the invention,
- 4-20% by weight of a binder,
- 0-10% by weight of conductivity improvers and
- 0-40% by weight of graphite having a mean particle diameter of from 1 µm to 100 µm, where the proportions of the components add up to not more than 100% by weight.

As conductivity improver, the anode material of the invention preferably comprises a conductive carbon black. It can be advantageous for the anode material of the invention to contain from 0 to 5% by weight, more preferably from 0.5 to 4% by weight, of conductive carbon black. The conductive carbon black present in the anode material of the invention is preferably a high-purity synthetic carbon black. This preferably has a mean particle diameter of from 20 to 60 nm, particularly preferably from 30 to 50 nm. It is also advantageous for the conductive carbon black present in the anode material of the invention to have a BET surface area of from 50 to 80 $m^2/g$, more preferably from 55 to 70 $m^2/g$. In a particular embodiment of the anode material of the invention, it comprises a high-purity synthetic carbon black having a mean particle diameter of from 35 to 45 nm and a BET surface area of from 57 to 67 $m^2/g$ as conductive carbon black.

It can likewise be advantageous for the anode material of the invention to contain from 4 to 20% by weight, preferably from 5 to 10% by weight and particularly preferably 10% by weight, of a binder. For the purposes of the present invention, a binder is a chemical compound which is able to bind the components of the coated carbon particles according to the invention, graphite and, if applicable, conductive carbon black to one another and to the current collector which preferably comprises copper, nickel or stainless steel. The anode material of the invention preferably comprises polymeric binders, more preferably polyvinylidene fluoride, polytetrafluoroethylene or polyolefins, but particularly preferably thermoplastic elastomers, in particular ethylene-propylene-diene terpolymers. In a particular embodiment of the anode material of the invention, it comprises gelatin or modified cellulose as binder.

The anode material of the invention preferably contains from 0 to 40% by weight of graphite which preferably has a mean particle diameter of from 1 to 100 µm, preferably from 2 to 50 µm. The graphite present in the anode material of the invention preferably has a $d_{90}$ of from 5 to 10 µm. For the purposes of the present invention, a $d_{90}$ of 6 µm means that 90% of all particles have a particle diameter of less than or equal to 6 µm. The graphite present in the composition preferably has a BET surface area of preferably from 5 to 30 $m^2/g$, more preferably from 10 to 20 $m^2/g$.

In a particularly preferred embodiment of the anode material of the invention, this comprises
- 5-86% by weight of the coated carbon particles of the invention,
- 4-20% by weight of a binder and
- 0-10% by weight of conductive carbon black, very particularly preferably
- 5-86% by weight of the coated carbon particles of the invention and
- 4-20% by weight of a binder, where the proportions of the components add up to not more than 100% by weight.

The present invention further provides a lithium ion battery comprising an anode comprising the anode material of the invention.

The electrolyte present in this lithium ion battery according to the invention is preferably an electrolyte composition composed of at least one organic solvent selected from among ethylene carbonate, dimethyl carbonate, ethyl methyl carbonate, diethyl carbonate, propylene carbonate, butylene carbonate, methyl propyl carbonate, butyl methyl carbonate and its isomers, 1,2-dimethoxyethane, tetrahydrofuran, 2-methyltetrahydrofuran, dialkyl esters of diethylene glycol, dioxolane, propylene oxide, dimethyl sulfoxide, dimethylformamide, formamide, nitromethane, gamma-butyrolactone, alkyl carboxylates and methyl lactate and, as electrolyte salt, at least one alkali metal salt or alkaline earth metal salt selected from among $LiPF_6$, $LiClO_4$, $LiAsF_6$, $LiBF_4$, $LiCF_3SO_3$, $LiN(CF_3SO_2)_2$, $LiN(SO_2CF_2CF_3)_2$, $LiSbF_6$, $LiAlCl_4$, $LiGaCl_4$, LiCl, $LiNO_3$, LiSCN, $LiO_3SCF_2CF_3$, $LiC_6F_5SO_3$, $LiO_2CCF_3$, $LiFSO_3$, $LiB(C_6H_5)_4$, $LiB(C_2O_4)_2$, lithium fluoroalkylphosphates. The concentration of the electrolyte salt is preferably from 0.5 mol/l to the solubility limit of the respective salt, but preferably 1 mol/l. In a particular embodiment of the lithium ion battery of the invention, this comprises an electrolyte comprising at least 50% by weight, preferably at least 80% by weight, of an ionic liquid. This electrolyte particularly preferably contains from 0.5 to 10% by weight of a film former such as vinylene carbonate. For the purposes of the present invention, the term ionic liquid refers to salts which have a melting point of not more than 100° C.

However, the lithium ion batteries of the invention can also comprise an electrolyte containing from 0.5 to 10% by weight, preferably from 2 to 5% by weight, of vinylene carbonate.

The lithium ion batteries of the invention preferably comprise an electrolyte comprising from 20 to 70% by volume of ethylene carbonate and/or 20 to 70% by volume of dimethyl carbonate, from 0.5 to 2 mol/l of $LiPF_6$ and an addition of from 0.5 to 5% by weight of vinylene carbonate. The lithium ion battery of the invention particularly preferably comprises an electrolyte comprising propylene carbonate together with from 0.5 to 2 mol/l of $LiPF_6$ and an addition of from 0.5 to 5% by weight of vinylene carbonate.

The cathodes present in the lithium ion batteries of the invention are cathodes according to the prior art.

The following examples illustrate the coated carbon particles according to the invention and their use according to the invention in the anode material, without the invention being restricted to this embodiment.

EXAMPLE 1

Production of Coated Carbon Particles According to the Invention 20 g of graphite (TIMREX KS6 from Timcal) were placed in a heatable rotary tube furnace. The furnace was heated to a temperature of 700° C. The tubular reaction space containing the initially charged graphite was rotated at a rotational speed of 5 revolutions per minute. A gas stream comprising argon as carrier gas and 10% by volume of monosilane ($SiH_4$) was passed at a flow rate of 50 sccm (standard cubic centimeters per minute; 1 sccm corresponds to 1 $cm^3$ of gas per minute, based on 0° C. and atmospheric pressure) through the reaction space of the rotary tube furnace. After a reaction time of 4 hours, coated carbon particles having a coating of elemental silicon were obtained.

Gravimetric analysis indicated that the coated carbon particles contain 7% by weight of silicon, based on the coated carbon particles. A scanning electron micrograph of a coated carbon particle is shown in FIG. 1.

EXAMPLE 2

Production of Anode Material According to the Invention 90 g of the coated carbon particles produced in example 1 and 10 g of the binder polyvinylidene fluoride (PVdF)

were firstly mixed mechanically, subsequently mixed one more time in an N-methyl-2-pyrrolidone suspension in which the PVdF is present as a 5% strength solution in N-methyl-2-pyrollidone by means of a high-speed stirrer and subsequently applied in a thickness of preferably 250 μm by means of a doctor blade to a 20 μm thick commercial copper foil which had been pretreated with a primer. The copper foil which has been coated in this way is subsequently dried at 80° C. under reduced pressure and subsequently rolled at about 80° C. Circular electrodes were subsequently stamped from this coated copper foil.

The treatment of the copper foil prior to coating with the electrode material of the invention was carried out using a commercial primer based on polymer resins. This increases the adhesion to the copper but itself has virtually no electrochemical activity. The primer used was the binding agent "Conti Plus" from ContiTech. It is a polymer adhesive which is based on polychloroprene and is free of heavy metals. It is applied in a layer thickness of from 5 to 30 μm.

EXAMPLE 3

Electrochemical Studies

Electrochemical cycling took place in a half-cell arrangement. In the half-cell arrangement, the anode material according to the invention was measured as working electrode in a sandwich arrangement comprising working electrode—separator/electrolyte—counterelectrode/reference electrode, with a lithium disk being used as counterelectrode/reference electrode. As limits to the potential, 100 mV and 1.0 V vs. $Li/Li^+$ were used. The cycling rate is reported together with the current density per unit active mass, which corresponds to the total mass of coated carbon particles, of the anode material.

Charging was carried out with a drop in current on reaching the voltage limit to below a value corresponding to 10 mA/g. The use of this drop in current makes it possible to separate the performance of an electrode (proportion of current which flows in a constant current mode, or galvanostatic proportion) from any irreversible damage (reflected in a reduction in the total capacity, i.e. including the current flowing in the potentiostatic step) (on the subject, see H. Buqa et al. in *ITE Battery Letters*, 4 (2003), 38).

The electrochemical studies were carried out in a classical manner, i.e. using a switch-off mode based exclusively on the upper and lower limits to the potential for the individual half cycles. This is the mode employed in all customary batteries.

The electrochemical studies were carried out using 0.5 ml of an electrolyte composed of 98% by weight of a mixture of 50% by weight of ethylene carbonate and 50% by weight of dimethyl carbonate containing 1 mol/l of $LiPF_6$ based on the mixture, and 2% by weight of vinylene carbonate.

Figure 2:
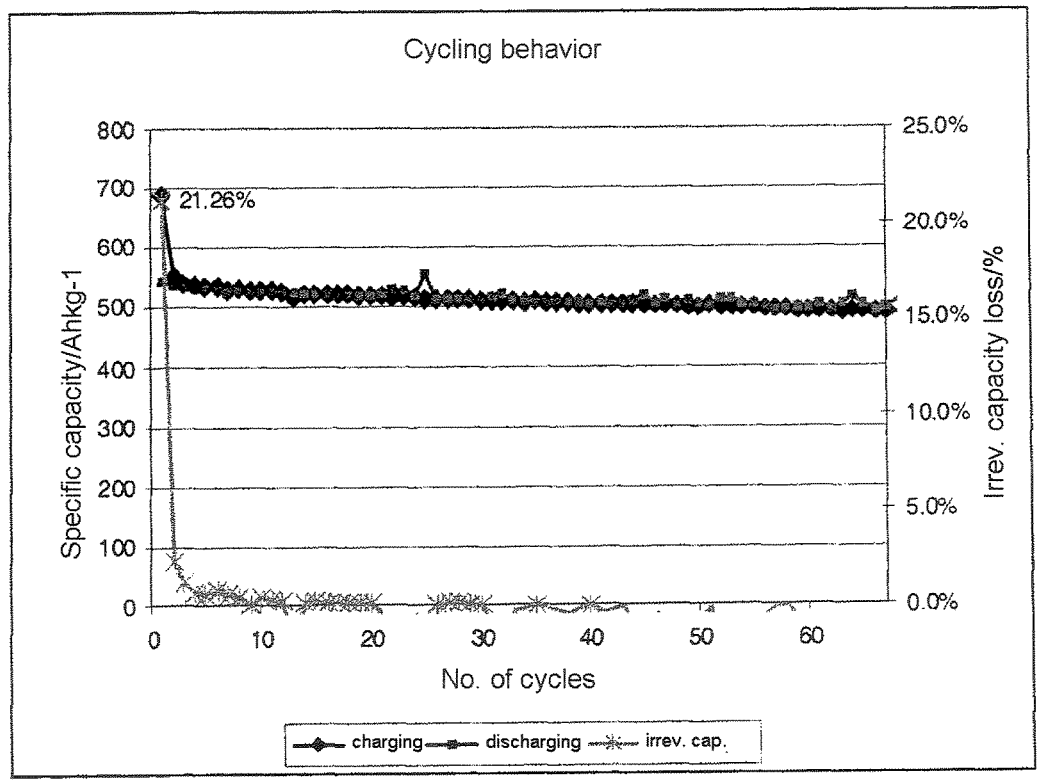

FIG. 2 shows the results of the electrochemical study (cycling was carried out at 50 mAh/g). The irreversible capacity loss is about 21% at the beginning of cycling and is then very low. Fading is, for example, 1.6% between cycle 11 and cycle 20. For the purposes of the present invention, fading is the decrease in the reversible (utilizable) capacity as the number of cycles increases. The irreversible capacity quickly assumes a value of 0.2-0.3%. The electrochemical capacity is about 2000 mAh/g. The cumulated irreversible capacity losses over the first 10 cycles are only 29%. The use of the coated carbon particles of the invention in the anode material makes it possible to improve the cycling properties and the mechanical stability of the anode material after a large number of cycles is improved.

The invention claimed is:

1. A coated carbon particle, comprising:
    an electrically conductive carbon core having a surface; and
    a silicon coating that coats the surface of the electrically conductive carbon core, the silicon coating comprising an elemental doped or undoped silicon directly bonded to said electrically conductive carbon core,
    wherein the silicon coating is formed by chemical vapor deposition such that the silicon coating further comprises lithium in an amount of 20-40% by weight.

2. A process for producing coated carbon particles, which comprises:
    coating electrically conductive carbon particles with elemental doped or undoped silicon by chemical vapor deposition from at least one gaseous silane in an oxygen-free gas atmosphere in a reaction space, with the electrically conductive carbon particles being in continual motion during the vapor deposition,
    wherein each of the coated carbon particles is the coated carbon particle of claim 1, and the coating comprises incorporating lithium in the elemental doped or undoped silicon in an amount of 20-40% by weight.

3. The process as claimed in claim 2, wherein the carbon particles are amorphous and/or crystalline in the form of graphite.

4. The process as claimed in claim 2, wherein carbon particles having a mean particle diameter of from 10 nm to 44 μm are used as starting material.

5. The process as claimed in claim 2, wherein carbon particles having a BET surface area of from 5 to 700 m$^2$/g are used as starting material.

6. The process as claimed in claim 2, wherein graphite particles are used as carbon particles.

7. The process as claimed in claim 2, wherein a gas stream comprising at least one gaseous silane and argon is introduced into the reaction space.

8. The process as claimed in claim 7, wherein the gas stream comprises from 5 to 50% by volume of gaseous silane.

9. The process as claimed in claim 7, wherein the gas stream comprises gaseous compounds of doping elements selected from among phosphorus, arsenic, antimony, boron, aluminum, gallium and indium in addition to the gaseous silane.

10. The process as claimed in claim 7, wherein the gas stream comprises only monosilane $SiH_4$ as gaseous silane.

11. The process as claimed in claim 9, wherein the decomposition of the gaseous silane and of the gaseous compounds of the doping elements to form elemental doped or undoped silicon is carried out at a temperature of from 500 to 1400° C.

12. The coated carbon particle as claimed in claim 1, wherein the electrically conductive carbon core comprises at least one of amorphous graphite and crystalline graphite.

13. The coated carbon particle as claimed in claim 12, wherein the coated carbon particle has a mean particle diameter of from 10 nm to 65 μm.

14. The coated carbon particle as claimed in claim 1, wherein the coated carbon particles comprises from 4 to 60% by weight of silicon based on the coated carbon particle.

15. The coated carbon particle as claimed in claim 1, wherein the silicon coating comprises doping elements selected from the group consisting of phosphorus, arsenic, antimony, boron, aluminum, gallium and indium.

16. An anode material for lithium ion batteries comprising the coated carbon particle as claimed in claim 1.

17. The anode material as claimed in claim 16, wherein the anode material comprises
    5-86% by weight of the coated carbon particle;
    4-20% by weight of a binder;
    0-10% by weight of a conductivity improver; and
    0-40% by weight of graphite having a mean particle diameter of from 1 μm to 100 μm,
    where proportions of the coated carbon particle, the binder, the conductivity improver, and the graphite add up to not more than 100% by weight.

18. The anode material as claimed in claim 16, wherein the anode material comprises:
    5-86% by weight of the coated carbon particle;
    4-20% by weight of a binder; and
    0-10% by weight of a conductivity improver;
    where proportions of the coated carbon particle, the binder, and the conductivity improver add up to not more than 100% by weight.

19. A lithium ion battery comprising an anode comprising the anode material as claimed in claim 16.

20. The coated carbon particle according to claim 1, wherein the electrically conductive carbon core has a carbon purity of at least 99%.

21. The coated carbon particle according to claim 1, wherein particles of the electrically conductive carbon core have a specific resistance of $10^{-2}$ Ωcm or less.

22. The coated carbon particle according to claim 1, wherein the coated carbon particle is produced by a process comprising coating the surface of the electrically conductive carbon core with the silicon coating comprising the elemental doped or undoped silicon by the chemical vapor deposition from at least one gaseous silane in an oxygen-free gas atmosphere in a reaction space, with the electrically conductive carbon core being in continual motion during the chemical vapor deposition.

* * * * *